(12) United States Patent
So et al.

(10) Patent No.: US 11,909,099 B2
(45) Date of Patent: Feb. 20, 2024

(54) ANTENNA MODULE

(71) Applicant: SAMSUNG ELECTRONICS CO., LTD., Suwon-si (KR)

(72) Inventors: Won Wook So, Suwon-si (KR); Jin Seon Park, Suwon-si (KR); Young Sik Hur, Suwon-si (KR); Jung Chul Gong, Suwon-si (KR); Yong Ho Baek, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 286 days.

(21) Appl. No.: 17/517,874

(22) Filed: Nov. 3, 2021

(65) Prior Publication Data
US 2022/0059926 A1 Feb. 24, 2022

Related U.S. Application Data

(63) Continuation of application No. 16/291,594, filed on Mar. 4, 2019, now Pat. No. 11,177,551.

(30) Foreign Application Priority Data

Jul. 17, 2018 (KR) ........................ 10-2018-0083118

(51) Int. Cl.
*H01Q 1/22* (2006.01)
*H01Q 1/24* (2006.01)
(Continued)

(52) U.S. Cl.
CPC ....... *H01Q 1/2283* (2013.01); *H01L 23/3107* (2013.01); *H01L 23/5226* (2013.01);
(Continued)

(58) Field of Classification Search
CPC .... H01Q 1/2283; H01Q 1/243; H01Q 9/0407; H01Q 21/08; H01Q 1/22; H01Q 1/38;
(Continued)

(56) References Cited

U.S. PATENT DOCUMENTS 6,972,964 B2 12/2005 Ho et al.
9,978,731 B1 5/2018 Kim
(Continued)

FOREIGN PATENT DOCUMENTS

CN 108257926 A 7/2018
JP 2008-78207 A 4/2008
(Continued)

OTHER PUBLICATIONS

Communication dated May 24, 2019 issued by the Korean Intellectual Property Office in counterpart Korean Application No. 10-2018-0083118.
(Continued)

*Primary Examiner* — David E Lotter
(74) *Attorney, Agent, or Firm* — Sughrue Mion, PLLC

(57) ABSTRACT

An antenna module includes an antenna substrate including an antenna pattern; a semiconductor package disposed on a lower surface of the antenna substrate, electrically connected to the antenna substrate, and having a semiconductor chip embedded therein; and an electronic component disposed at a side of the antenna substrate, electrically connected to the antenna substrate, and spaced apart from the semiconductor package by a predetermined distance. The antenna module includes a connection substrate connected to a portion of the antenna substrate, the connection substrate having an extension portion extending outward from the side of the antenna substrate, and the electronic component is disposed on the extension portion of the connection substrate to electrically connect to an inner wiring layer of the antenna substrate.

20 Claims, 14 Drawing Sheets

US 11,909,099 B2
Page 2

(51) Int. Cl.
  *H01L 23/00* (2006.01)
  *H01L 23/66* (2006.01)
  *H01L 23/31* (2006.01)
  *H01L 23/522* (2006.01)
(52) U.S. Cl.
  CPC .............. *H01L 23/66* (2013.01); *H01L 24/09* (2013.01); *H01L 24/17* (2013.01); *H01L 24/33* (2013.01); *H01Q 1/243* (2013.01); *H01L 2223/6672* (2013.01); *H01L 2223/6677* (2013.01); *H01L 2224/02377* (2013.01); *H01L 2224/02379* (2013.01)
(58) Field of Classification Search
  CPC ... H01Q 1/50; H01L 23/3107; H01L 23/5226; H01L 23/66; H01L 24/09; H01L 24/17; H01L 24/33; H01L 2223/6672; H01L 2223/6677; H01L 2224/02377; H01L 2224/02379; H01L 23/552; H01L 25/16; H01L 23/3128; H01L 24/20; H01L 2224/18
  See application file for complete search history.

(56) References Cited

U.S. PATENT DOCUMENTS

| | | | |
|---|---|---|---|
| 10,103,696 B1 | 10/2018 | Mitzlaff | |
| 11,676,907 B2 * | 6/2023 | Lee | .......................... H01L 23/13 257/668 |
| 2008/0076249 A1 | 3/2008 | Fujii et al. | |
| 2009/0079648 A1 | 3/2009 | Matsuo et al. | |
| 2009/0230541 A1 | 9/2009 | Araki et al. | |
| 2009/0244850 A1 | 10/2009 | Suh et al. | |
| 2012/0235881 A1 | 9/2012 | Pan et al. | |
| 2013/0112754 A1 | 5/2013 | Ikemoto | |
| 2014/0028518 A1 | 1/2014 | Arnold et al. | |
| 2014/0104133 A1 | 4/2014 | Finn et al. | |
| 2016/0240492 A1 * | 8/2016 | Wolter | .................... H01L 23/66 |
| 2016/0261048 A1 | 9/2016 | Suzuki et al. | |
| 2016/0365341 A1 | 12/2016 | Then et al. | |
| 2017/0084554 A1 * | 3/2017 | Dogiamis | ......... H01L 23/49838 |
| 2018/0145033 A1 | 5/2018 | Yi et al. | |
| 2018/0182691 A1 * | 6/2018 | Cho | ........................ H01L 24/20 |
| 2019/0139915 A1 | 5/2019 | Dalmia et al. | |

FOREIGN PATENT DOCUMENTS

| | | |
|---|---|---|
| JP | 4394147 B2 | 10/2009 |
| JP | 5545371 B2 | 7/2014 |
| KR | 10-2018-0058095 A | 5/2018 |

OTHER PUBLICATIONS

Communication dated Dec. 12, 2019, issued by the Taiwan Patent Office in counterpart Taiwan Application No. 108106274.
Communication dated Apr. 27, 2023, issued by the China National Intellectual Property Administration in counterpart Chinese Application No. 201910576529.0.

* cited by examiner

ANTENNA MODULE

CROSS-REFERENCE TO RELATED APPLICATION(S)

This application is a Continuation application of U.S. application Ser. No. 16/291,594, filed Mar. 4, 2019, which claims benefit of priority to Korean Patent Application No. 10-2018-0083118 filed on Jul. 17, 2018 in the Korean Intellectual Property Office, the disclosures of each of which are incorporated by reference herein in their entireties.

TECHNICAL FIELD

The present disclosure relates to an antenna module.

BACKGROUND

Recently, in accordance with the trend for thinness of electronic devices, thicknesses of various components in a mobile device, such as a smartphone, are significantly limited. Therefore, when a millimeter wave/5G antenna module is used in a mobile device, inevitably there are many limitations in a size, a thickness, and the like, of the millimeter wave/5G antenna module antenna module in order to secure a degree of freedom of a mounting position of the millimeter wave/5G antenna module within a set.

SUMMARY

An aspect of the present disclosure may provide an antenna module of which a degree of freedom may be secured when the antenna module is mounted in a set by a reduction in an overall thickness thereof.

According to an aspect of the present disclosure, an antenna module may be provided, in which a semiconductor package including a semiconductor chip is mounted on an antenna substrate and a passive component having a thickness greater than that of the semiconductor chip is mounted separately from the semiconductor package on the antenna substrate or a connection substrate.

According to an aspect of the present disclosure, an antenna module may include: an antenna substrate including an antenna pattern; a semiconductor package disposed on a lower surface of the antenna substrate, electrically connected to the antenna substrate, and having at least one semiconductor chip embedded therein; and an electronic component disposed on the lower surface or a side surface of the antenna substrate, electrically connected to the antenna substrate, and spaced apart from the semiconductor package by a predetermined distance. The electronic component may have a thickness greater than that of the semiconductor chip.

According to an aspect of the present disclosure, an antenna module may include: an antenna substrate including an antenna pattern; a semiconductor package disposed on a lower surface of the antenna substrate, electrically connected to the antenna substrate, and having a semiconductor chip embedded therein; and a connection substrate, on which an electronic component is disposed, connected to the antenna substrate. The electronic component may have a thickness greater than that of the semiconductor chip, and may be spaced apart from the antenna substrate and electrically connected to the antenna substrate through the connection substrate.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Herein, a lower side, a lower portion, a lower surface, and the like, are used to refer to a downward direction in relation to cross sections of the drawings for convenience, while an upper side, an upper portion, an upper surface, and the like, are used to refer to an opposite direction to the downward direction. However, these directions are defined for convenience of explanation, and the claims are not particularly limited by the directions defined as described above, and concepts of upper and lower portions may be exchanged with each other.

The meaning of a "connection" of a component to another component in the description conceptually includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
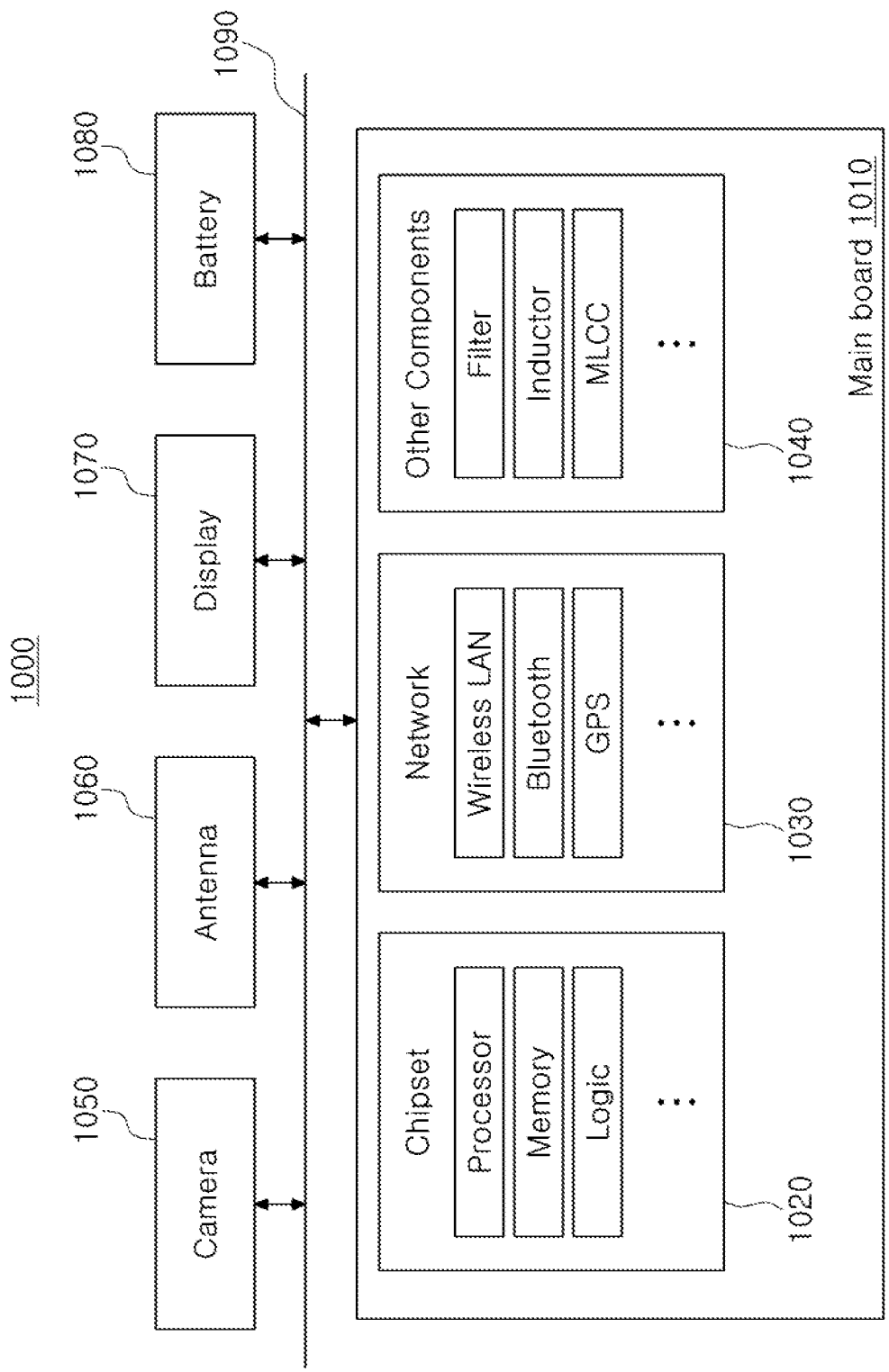
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
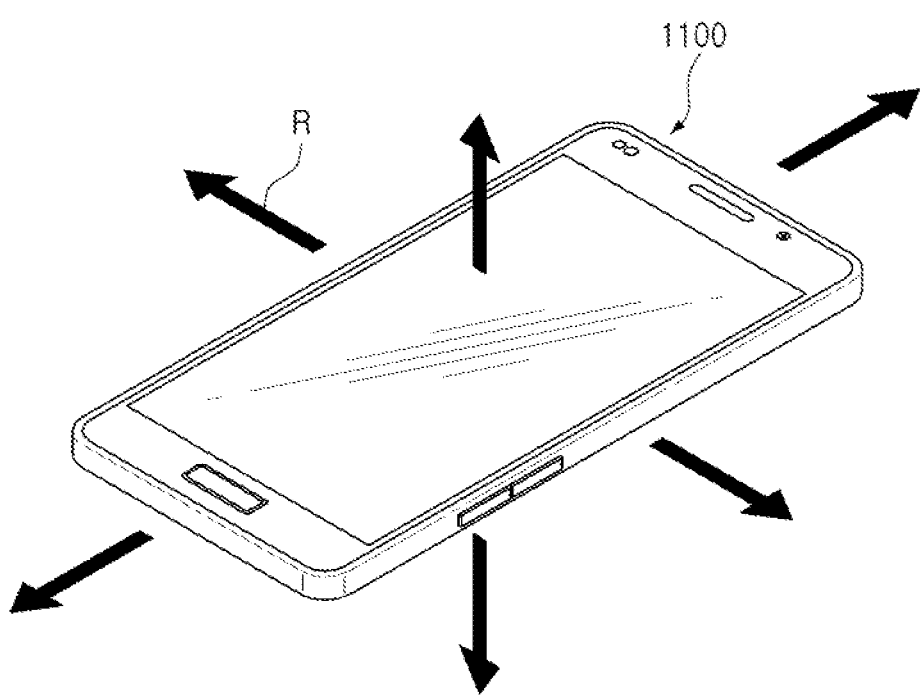
FIG. 2 is a schematic perspective view illustrating an example of an electronic device.

FIG. 2 is a schematic perspective view illustrating an example of an electronic device.

Referring to FIG. 2, an electronic device may be, for example, a smartphone 1100. In the smartphone 1100, a radio frequency integrated circuit (RFIC) may be used in a semiconductor package form, and an antenna may be used in a substrate or module form. The RFIC and the antenna may be electrically connected to each other in the smartphone 1100, and radiation R of antenna signals in various directions may be thus possible. A semiconductor package including the RFIC and a substrate or a module including the antenna may be used in various forms in an electronic device such as the smartphone, or the like.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3A:
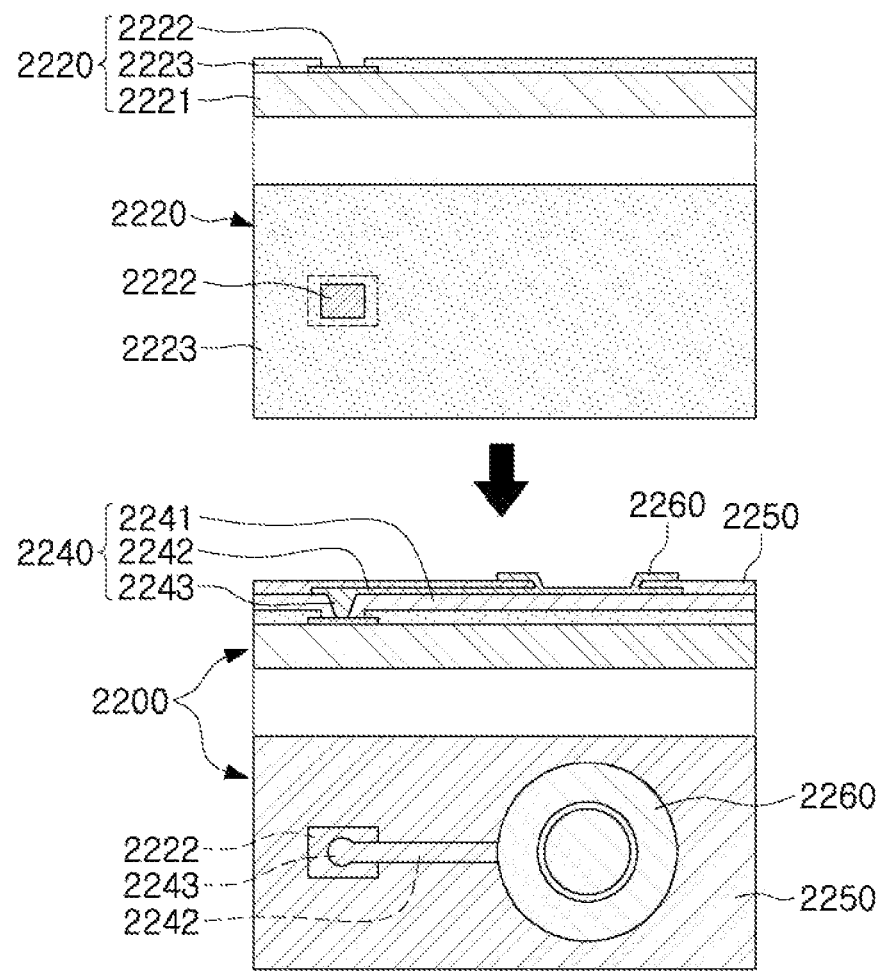
FIGS. 3A and 3B are schematic cross-sectional views illustrating states of a fan-in semiconductor package before and after being packaged.
Figure 3B:
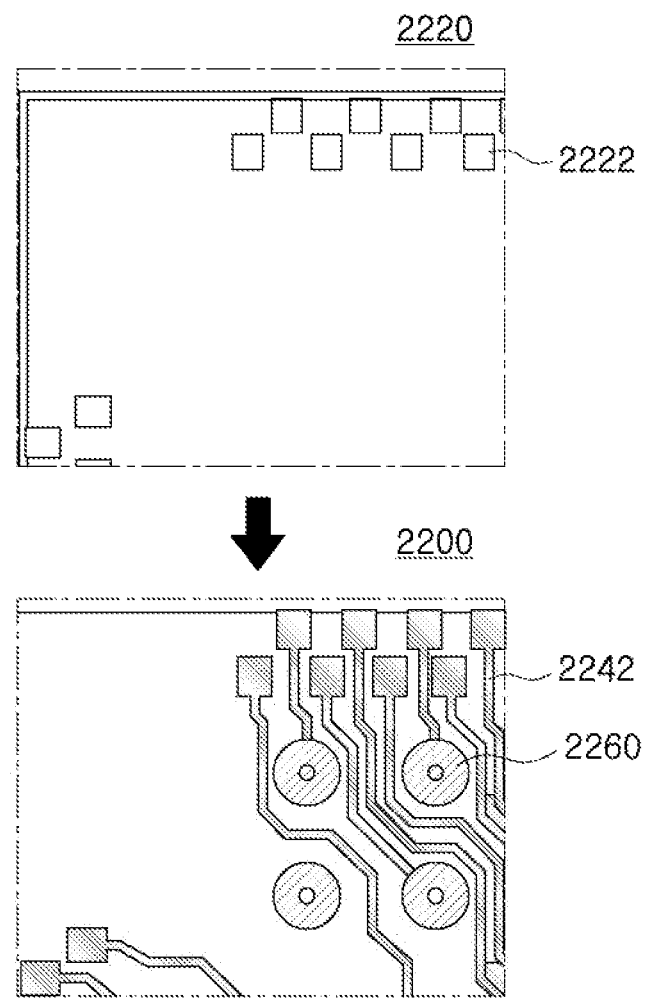

FIGS. 3A and 3B are schematic cross-sectional views illustrating states of a fan-in semiconductor package before and after being packaged.

Figure 4:
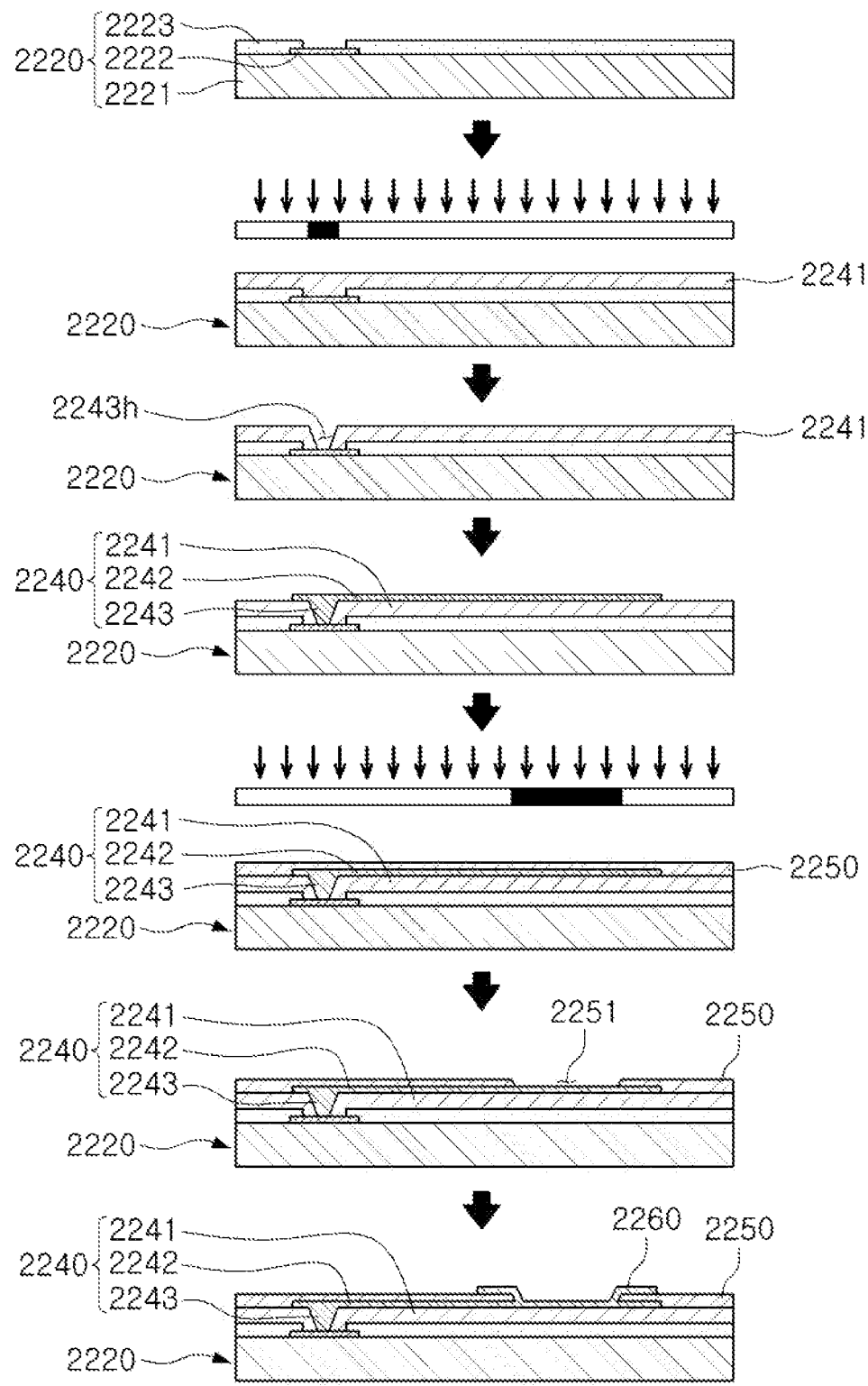
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3A to 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a metal material such as aluminum (Al), or the like, and a passivation layer 2223 such as an oxide layer, a nitride layer, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection structure 2240 may be formed depending on a size of the semiconductor chip 2220 on the semiconductor chip 2220 in order to redistribute the connection pads 2222. The connection structure 2240 may be formed by forming an insulating layer 2241 on the semiconductor chip 2220 using an insulating material such as a photoimageable dielectric (PID) resin, forming via holes 2243h opening the connection pads 2222, and then forming wiring patterns 2242 and vias 2243. Then, a passivation layer 2250 protecting the connection structure 2240 may be formed, an opening 2251 may be formed, and an underbump metal layer 2260, or the like, may be formed. That is, a fan-in semiconductor package 2200 including, for example, the semiconductor chip 2220, the connection structure 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in electronic component package on the mainboard of the electronic device.

Figure 5:
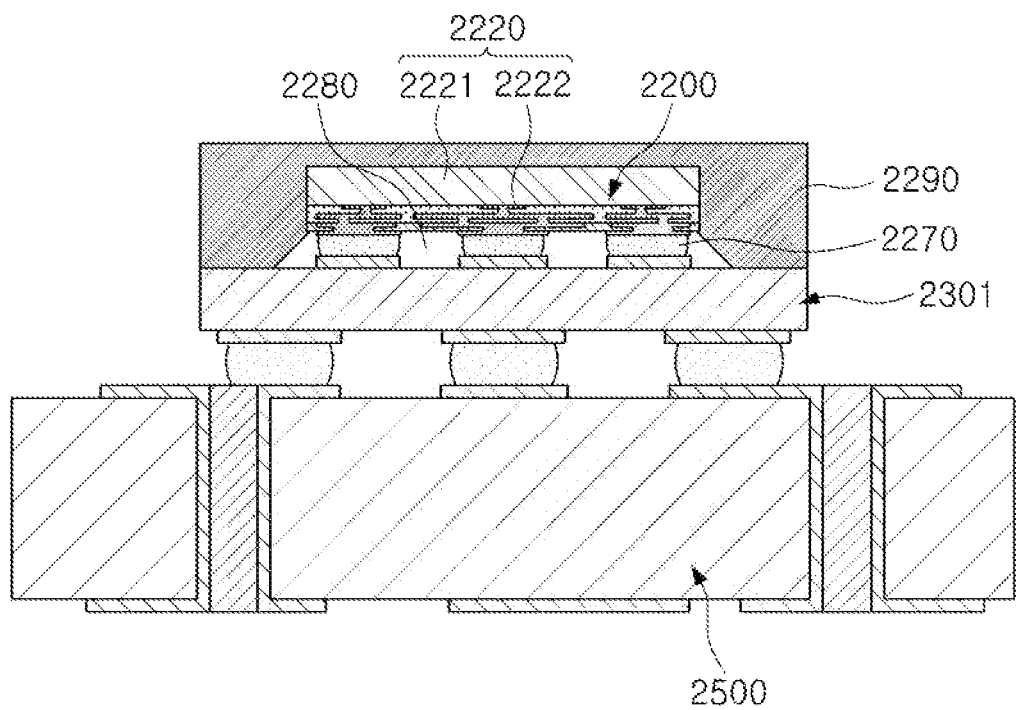
FIG. 5 is a schematic cross-sectional view illustrating a case in which a fan-in semiconductor package is mounted on a printed circuit substrate and is ultimately mounted on a mainboard of an electronic device.

FIG. 5 is a schematic cross-sectional view illustrating a case in which a fan-in semiconductor package is mounted on a printed circuit substrate and is ultimately mounted on a mainboard of an electronic device.

Figure 6:
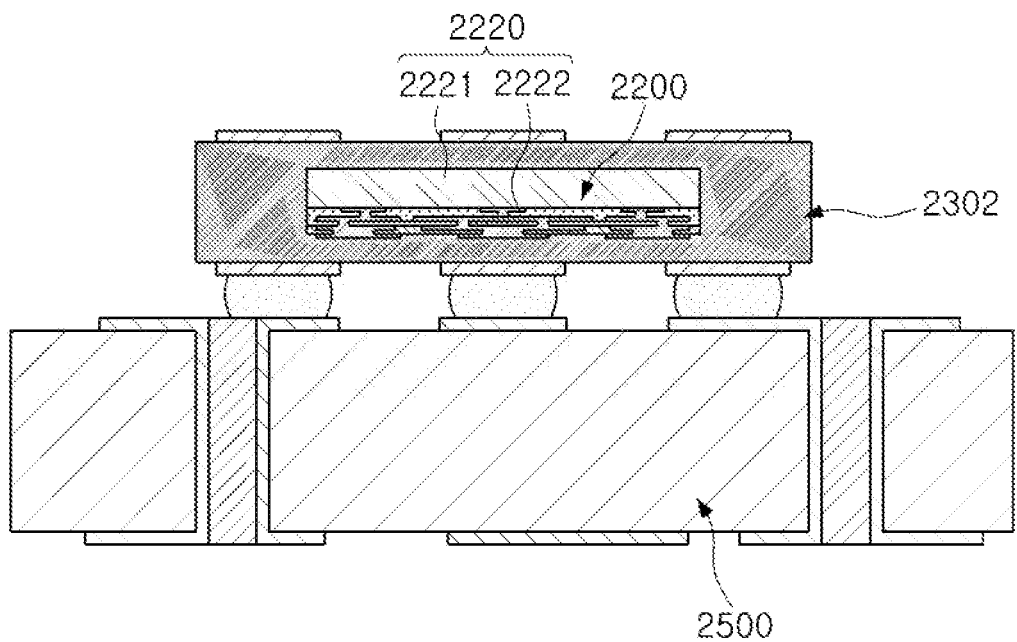
FIG. 6 is a schematic cross-sectional view illustrating a case in which a fan-in semiconductor package is embedded in a printed circuit board and is ultimately mounted on a mainboard of an electronic device.

FIG. 6 is a schematic cross-sectional view illustrating a case in which a fan-in semiconductor package is embedded in a printed circuit board and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through a printed circuit board 2301, and the fan-in semiconductor package 2200 may be ultimately mounted on a mainboard 2500 of an electronic device in a state in which it is mounted on the printed circuit board 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate printed circuit board 2302, connection pads 2222, that is, I/O terminals, of the semiconductor chip 2220 may be redistributed by the printed circuit board 2302 in a state in which the fan-in semiconductor package 2200 is embedded in the printed circuit board 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate printed circuit board and be then mounted on the mainboard of the electronic device through a packaging process or may be mounted and used on the mainboard of the electronic device in a state in which it is embedded in the printed circuit board.

Fan-Out Semiconductor Package

Figure 7:
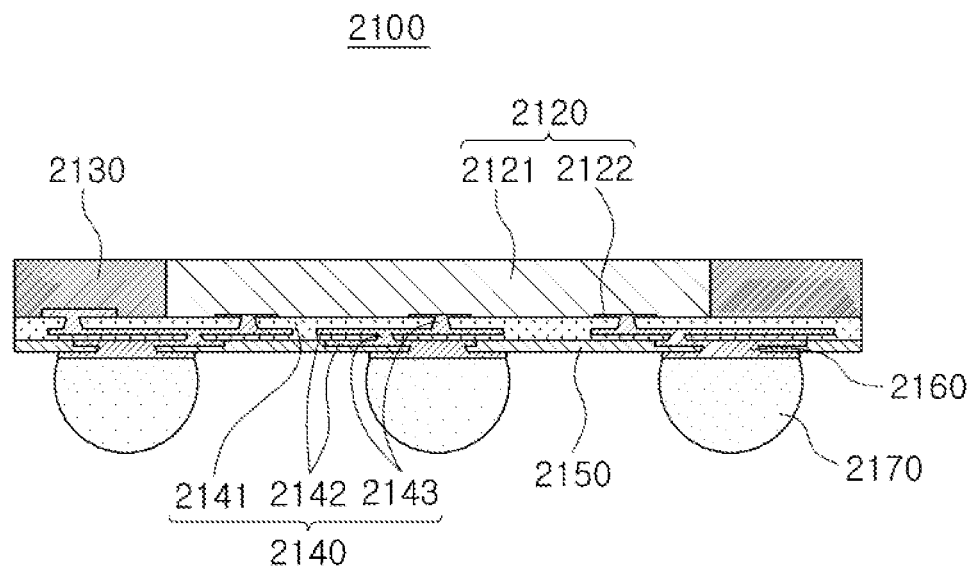
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection structure 2140. In this case, a passivation layer 2150 may further be formed on the connection structure 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, and the like. The connection structure 2140 may include an insulating layer 2141, wiring layers 2142 formed on the insulating layer 2141, and vias 2143 electrically connecting the connection pads 2122 and the wiring layers 2142 to each other.

As described above, the fan-out semiconductor package may have a form in which I/O terminals of the semiconductor chip are redistributed and disposed outwardly of the semiconductor chip through the connection structure formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection structure formed on the semiconductor chip as described above. Therefore, even in a case that a size of the semiconductor chip is decreased, a standardized ball layout may be used in the fan-out semiconductor package as it is, such that the fan-out semiconductor package may be mounted on the mainboard of the electronic device without using a separate printed circuit board, as described below.

Figure 8:
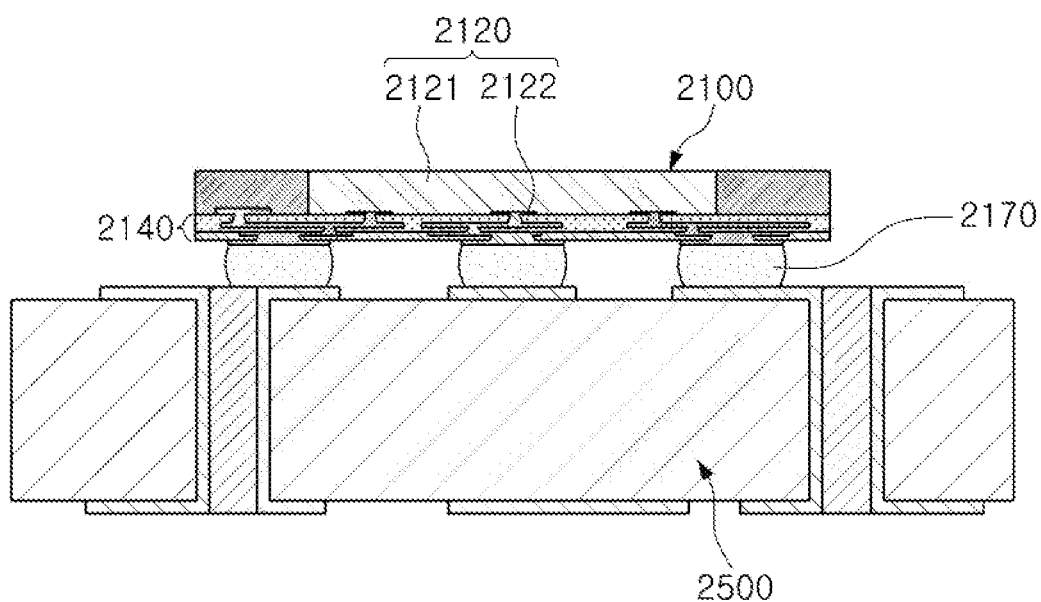
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection structure 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate printed circuit board, or the like.

As described above, since the fan-out semiconductor package may be mounted on the mainboard of the electronic device without using the separate printed circuit board, the fan-out semiconductor package may be implemented at a thickness lower than that of the fan-in semiconductor package using the printed circuit board. Therefore, the fan-out semiconductor package may be miniaturized and thinned. In addition, the fan-out electronic component package has excellent thermal characteristics and electrical characteristics, such that it is particularly appropriate for a mobile product. Therefore, the fan-out electronic component package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

Antenna Module

Figure 9:
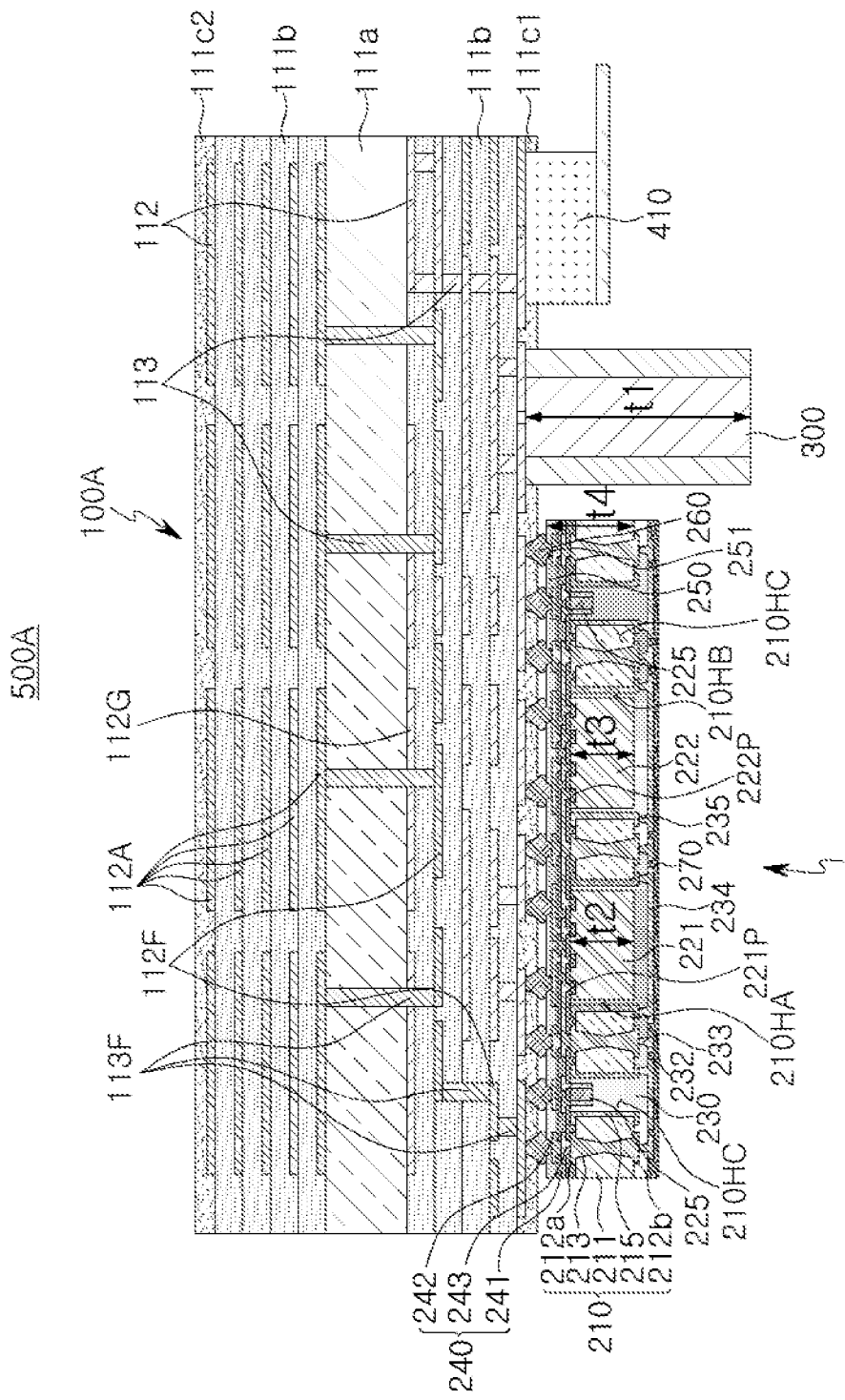
FIG. 9 is a schematic cross-sectional view illustrating an antenna module according to an exemplary embodiment in the present disclosure.

FIG. 9 is a schematic cross-sectional view illustrating an antenna module according to an exemplary embodiment in the present disclosure.

Referring to FIG. 9, an antenna module 500A according to an exemplary embodiment in the present disclosure may include an antenna substrate 100A, a semiconductor package 200A disposed on a lower surface of the antenna substrate 100A and electrically connected to the antenna substrate 100A, an electronic component 300 disposed on the lower surface of the antenna substrate 100A and electrically connected to the antenna substrate 100A, and a connector 410 disposed beneath the antenna substrate 100A and connected to the antenna substrate 100A. In this case, a thickness t1 of the electronic component 300 may be greater than thicknesses t2 and t3 of semiconductor chips 221 and 222. The thickness t1 of the electronic component 300 may be greater than a thickness t4 of the semiconductor package 200A. The thickness t4 of the semiconductor package 200A refers to a thickness except for an electrical connection structure 260 such as a solder ball.

Recently, in accordance with the trend toward thinness of electronic devices, thicknesses of various components in a mobile device such as a smartphone are significantly limited. Therefore, when a millimeter wave/5G antenna module is used in the mobile device, inevitably there are many limitations in a size, a thickness, and the like, of the millimeter wave/5G antenna module antenna module in order to secure a degree of freedom of a mounting position of the millimeter wave/5G antenna module within a set.

Meanwhile, when an antenna module is implemented in a general system-in-package (SIP) type module manner, various semiconductor chips and passive components are mounted on a bottom surface of an antenna substrate by surface mount technology (SMT), and in order to prevent electromagnetic interference (EMI), a shield can covering the semiconductor chips and the passive components is attached to the semiconductor chips and the passive components or the semiconductor chips and the passive components are covered with an epoxy molding compound (EMC), and a metal layer is then formed on an outer surface of the EMC. In this case, since an overall thickness of the module is determined by a passive component, particularly, a component having a great thickness, such as a power inductor (PI), there is a limitation in reducing the overall thickness of the module unless a thickness of the power inductor is reduced or a method of mounting the power inductor is changed.

On the other hand, in the antenna module 500A according to the exemplary embodiment, the semiconductor package 200A in which various semiconductor chips 221 and 222 and passive components 225 are packaged as a single package may be mounted on the antenna substrate 100A, and the electronic component 300 having a great thickness may be mounted separately from the semiconductor package 200A on the antenna substrate 100A by surface-mounting technology (SMT). That is, the semiconductor chips 221 and 222 and the passive components 225 having a small thickness may be packaged as the single package to manufacture the semiconductor package 200A capable of stably implementing various performances required in the antenna module even though it has a small thickness, a method for shielding electromagnetic interference (EMI) as described below in the single semiconductor package 200A may be considered to omit the shield can described above, and the electronic component 300 itself having the great thickness may be directly mounted separately from the semiconductor package 200A on the antenna substrate 100A. Therefore, an overall thickness of the antenna module 500A may be reduced.

Components of the antenna module 500A according to the exemplary embodiment will hereinafter be described in more detail with reference to the drawing.

The antenna substrate 100A, which is a region capable of implementing a millimeter wave/5G antenna, may include antenna patterns 112A and ground patterns 112G. In detail, the antenna substrate 100A may include a core layer 111a, insulating layers 111b, passivation layers 111c1 and 111c2, wiring layers 112, and connection via layers 113. The antenna substrate 100A according to the exemplary embodiment may have a form in which the insulating layers 111b are built-up on opposite surfaces of the core layer 111a. In this case, the wiring layers 112 may be disposed on the core layer 111a and the respective insulating layers 111b. The wiring layers 112 may be electrically connected to each other through the connection via layers 113 penetrating through the core layer 111a and the respective insulating layers 111b.

The antenna patterns 112A of the wiring layers 112 may be disposed on an upper surface of the core layer 111a, and the ground patterns 112G of the wiring layers 112 may be disposed on a lower surface of the core layer 111a. The antenna patterns 112A may be disposed, respectively, on the insulating layers 111b built-up on the core layer 111a. The antenna patterns 112A disposed, respectively, on the insulating layers 111b built-up on the core layer 111a may be disposed directly above or below each other and be coupled to each other. For example, the antenna patterns 112A may form a capacitance. However, a disposition of the antenna patterns 112A may be changed depending on a type of antenna, and the insulating layers 111b may be built-up only beneath the core layer 111a, if necessary. In this case, the antenna patterns 112A formed on the insulating layers 111b built-up on the core layer 111a may be omitted.

The antenna patterns 112A disposed on the upper surface of the core layer 111a may be connected to at least one of the semiconductor chips 221 and 222 through feeding patterns 112F of the wiring layers 112 and feeding vias 113F of the connection via layers 113 in an electrical manner and/or a signal manner. The ground patterns 112G may be electrically connected to at least one of the semiconductor chips 221 and 222 and the electronic component 300 through other ground patterns of the wiring layers 112 and ground connection vias of the connection via layers 113. Since the core layer 111a is disposed between the antenna patterns 112A and the ground patterns 112G, radiation characteristics of an antenna may be maintained by stably securing a distance between the antenna and a ground plane in a single composite module regardless of a change in an external environment. In addition, the antenna substrate 100A may be miniaturized by appropriately using a dielectric constant (Dk) of the core layer 111a to reduce a size of the antenna module 500A. Therefore, an entire structure of the antenna module 500A may be simplified, resulting in improvement of spatial efficiency and a reduction in a cost.

An insulating material may be used as a material of the core layer 111a. In this case, the insulating material may be a thermosetting resin such as an epoxy resin, a thermoplastic resin such as a polyimide resin, a material including a reinforcing material such as a glass fiber (or a glass cloth or a glass fabric) and/or an inorganic filler together with the thermosetting resin and the thermoplastic resin, for example, prepreg. However, the material of the core layer 111a is not limited to the resin, and may be, for example, a glass plate or a ceramic plate. A thickness of the core layer 111a may be greater than that of each of the insulating layers 111b in order to secure a sufficient distance between the antenna patterns 112A and the ground patterns 112G.

An insulating material may be used as a material of each of the insulating layers 111b. In this case, the insulating material may be a thermosetting resin such as an epoxy resin, a thermoplastic resin such as a polyimide resin, a material including a reinforcing material such as an inorganic filler together with the thermosetting resin and the thermoplastic resin, for example, an Ajinomoto Build-up Film (ABF). However, the material of each of the insulating layers is not limited thereto, but may also be a photoimageable dielectric (PID). When materials of the insulating layers 111b are the same as each other, a boundary between the insulating layers may be apparent.

The passivation layers 111c1 and 111c2 may be disposed on outermost layers of the antenna substrate 100A to protect internal components of the antenna substrate 100A. Each of the passivation layers 111c1 and 111c2 may also include an insulating material, for example, an ABF, but is not limited thereto. Openings (not denoted by reference numeral) exposing at least portions of the wiring layer 112 in order to electrically connect the wiring layer 112 to the electronic component 300 and/or the connector 410 may be formed in a lower passivation layer 111c1.

The wiring layers 112 may include the antenna patterns 112A substantially implementing the millimeter wave/5G antenna, and may include other ground patterns 112G, feeding patterns 112F, and the like. The antenna patterns 112A may be a dipole antenna, a patch antenna, or the like, depending on a disposition and a shape of the antenna patterns 112A. The ground patterns 112G may have a ground plane form. The antenna patterns 112A may be surrounded by ground patterns (not illustrated) disposed on the same level, but are not limited thereto. The wiring layers 112 may include signal patterns, power patterns, resistor patterns, or the like. A material of each of the wiring layers 112 may be a conductive material such as copper (Cu), aluminum (Al), silver (Ag), tin (Sn), gold (Au), nickel (Ni), lead (Pb), titanium (Ti), or alloys thereof, but is not limited thereto.

The connection via layers 113 may electrically connect the wiring layers 112 formed on different layers to each other, resulting in an electrical path in the antenna substrate 100A. The connection via layers 113 may include the feeding vias 113F, and may include ground connection vias, or the like. The connection via layers 113 may further include signal connection vias, power connection vias, or the like. The feeding vias 113F may be connected to the antenna patterns 112A in an electrical manner and/or a signal manner. Some ground connection vias (not illustrated) may tightly surround the feeding vias 113F. A material of each of the connection via layers 113 may be a conductive material such as copper (Cu), aluminum (Al), silver (Ag), tin (Sn), gold (Au), nickel (Ni), lead (Pb), titanium (Ti), or alloys thereof. A connection via of each of the connection via layers 113 may be completely filled with the conductive material, or the conductive material may be formed along a wall of each of via holes unlike illustrated in the drawing. In addition, each of the connection via layers may have all of any known vertical cross-sectional shapes such as a cylindrical shape, an hourglass shape, a tapered shape, or the like.

The semiconductor package 200A may include a frame 210 having first to third through-holes 210HA, 210HB, and 210HC and including a plurality of wiring layers 212a and 212b, a first semiconductor chip 221 disposed in the first through-hole 210HA and having a first active surface having first connection pads 221P disposed thereon and a first inactive surface opposing the first active surface, a second semiconductor chip 222 disposed in the second through-hole 210HB and having a second active surface having second connection pads 222P disposed thereon and a second inactive surface opposing the second active surface, passive components 225 disposed in the third through-hole 210HC, an encapsulant 230 covering at least portions of each of the frame 210, the first inactive surface of the first semiconductor chip 221, the second inactive surface of the second semiconductor chip 222, and the passive components 225 and filling at least portions of each of the first to third through-holes 210HA, 210HB, and 210HC, and a connection structure 240 disposed on the frame 210, the first active surface of the first semiconductor chip 221, the second active surface of the second semiconductor chip 222, and the passive components 225 and including redistribution layers 242 electrically connected to each of the first connection pads 221P, the second connection pads 222P, and the passive components 225.

The frame 210 may include the wiring layers 212a and 212b to thus reduce the number of layers of the connection structure 240. In addition, the frame 210 may improve rigidity of the semiconductor package 200A depending on certain materials of an insulating layer 211, and serve to secure uniformity of a thickness of the encapsulant 230. A vertical electrical path may be provided in the semiconductor package 200A by the wiring layers 212a and 212b and connection vias 213 of the frame 210. The frame 210 may have the first to third through-holes 210HA, 210HB, and 210HC. The first semiconductor chip 221, the second semiconductor chip 222, and the passive components 225 may be disposed side by side in the first to third through-holes 210HA, 210HB, and 210HC, respectively, to be spaced apart from the frame 210 by predetermined distances. Side surfaces of the semiconductor chips 221 and 222 and the passive components 225 may be surrounded by the frame 210. However, such a form is only an example and may be variously modified to have other forms, and the frame 210 may perform another function depending on such a form.

The frame 210 may include an insulating layer 211, a first wiring layer 212a disposed on an upper surface of the insulating layer 211, a second wiring layer 212b disposed on a lower surface of the insulating layer 211, and connection vias 213 penetrating through the insulating layer 211 and electrically connecting the first and second wiring layers 212a and 212b to each other. The first and second wiring layers 212a and 212b of the frame 210 may have thicknesses greater than those of the redistribution layers 242 of the connection structure 240. Since the frame 210 may have a thickness similar to or greater than that of the semiconductor chips 221 and 222, or the like, the first and second wiring layers 212a and 212b may also be formed to have large sizes through a substrate process depending on a scale of the frame 210. On the other hand, the redistribution layers 242 of the connection structure 240 may be formed to have small sizes through a semiconductor process for thinness.

A material of the insulating layer 211 is not particularly limited. For example, an insulating material may be used as the material of the insulating layer 211. In this case, the insulating material may be a thermosetting resin such as an epoxy resin, a thermoplastic resin such as a polyimide resin, a resin in which the thermosetting resin or the thermoplastic resin is impregnated together with an inorganic filler in a core material such as a glass fiber (or a glass cloth or a glass fabric), for example, prepreg, or the like, but is not limited thereto. For example, a glass or a ceramic based insulating material having required material characteristics may be used as the material of the insulating layer 211.

The wiring layers 212a and 212b may serve to redistribute the connection pads 221P and 222P of the semiconductor chips 221 and 222. In addition, the wiring layers 212a and 212b may be used as connection patterns when the semiconductor package 200A is electrically connected to other components disposed on and beneath the semiconductor package 200A. A material of each of the wiring layers 212a and 212b may be a conductive material such as copper (Cu), aluminum (Al), silver (Ag), tin (Sn), gold (Au), nickel (Ni), lead (Pb), titanium (Ti), or alloys thereof. The wiring layers 212a and 212b may perform various functions depending on designs of corresponding layers. For example, the wiring layers 212a and 212b may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring layers 212a and 212b may include via pads, and the like.

The connection vias 213 may electrically connect the wiring layers 212a and 212b formed on different layers to each other, resulting in an electrical path in the frame 210. A material of each of the connection vias 213 may be a conductive material such as copper (Cu), aluminum (Al), silver (Ag), tin (Sn), gold (Au), nickel (Ni), lead (Pb), titanium (Ti), or alloys thereof. Each of the connection vias 213 may be completely filled with the conductive material, or the conductive material may be formed along a wall of each of connection via holes. In addition, each of the connection vias 213 may have any known shape such as an hourglass shape, a cylindrical shape, and the like. The connection vias 213 may also include signal connection vias, ground connection vias, and the like.

A metal layer 215 may further be disposed on each of walls of the through-holes 210HA, 210HB, and 210HC of the frame 210, if necessary. The metal layer 215 may be formed over the entire wall of each of the through-holes 210HA, 210HB, and 210HC to surround the semiconductor chips 221 and 222 and the passive components 225. Therefore, heat dissipation characteristics may be improved, and an electromagnetic wave shielding effect may be achieved. The metal layer 215 may extend to an upper surface and a lower surface of the frame 210, that is, the upper surface and the lower surface of the insulating layer 211. A material of the metal layer 215 may be a conductive material such as copper (Cu), aluminum (Al), silver (Ag), tin (Sn), gold (Au), nickel (Ni), lead (Pb), titanium (Ti), or alloys thereof. The metal layer 215 may be electrically connected to ground patterns and/or power patterns of the first wiring layer 212a and/or the second wiring layer 212b to be used as a ground plane.

Each of the semiconductor chips 221 and 222 may be an integrated circuit (IC) in a bare state, provided in an amount of several hundred to several million or more elements integrated in a single chip. For example, the IC of the first semiconductor chip 221 may be a radio frequency integrated circuit (RFIC), and the IC of the second semiconductor chip 222 may be a power management integrated circuit (PMIC). The semiconductor chips 221 and 222 may include bodies on which various circuits are formed, respectively, and the connection pads 221P and 222P may be formed on active surfaces of the bodies, respectively. The body may be formed on the basis of, for example, an active wafer. In this case, a base material of the body may be silicon (Si), germanium (Ge), gallium arsenide (GaAs), or the like. The connection pads 221P and 222P may electrically connect the semiconductor chips 221 and 222 to other components, respectively, and a material of each of the connection pads 221P and 222P may be a conductive material such as aluminum (Al), but is not limited thereto. The active surfaces of the semiconductor chips 221 and 222 refer to surfaces of the semiconductor chip 221 and 222 on which the connection pads 221P and 222P are disposed, and the inactive surfaces of the semiconductor chips 221 and 222 refer to surfaces of the semiconductor chips 221 and 222 opposing the active surfaces. Although not illustrated in the drawing, passivation layers having openings exposing at least portions of the connection pads 221P and 222P and formed of an oxide layer, a nitride layer, or the like, may be formed on the active surfaces of the semiconductor chips 221 and 222. The semiconductor chips 221 and 222 may be disposed in a face-up form to thus have minimum signal paths up to the antenna substrate 100A.

The passive components 225 may be disposed in the third through-hole 210HC side by side with the semiconductor chips 221 and 222. The passive component 225 may be any known passive component such as a capacitor, an inductor, or the like. As a non-restrictive example, the passive component 225 may be a capacitor, more specifically, a multilayer ceramic capacitor (MLCC). The passive components 225 may be electrically connected to the connection pads 221P and 222P of the semiconductor chips 221 and 222 through the connection structure 240. The number of passive components 225 is not particularly limited.

A thickness of each of the semiconductors 221 and 222 and a thickness of each of the passive components 225 may be smaller than that of the electronic component 300, and a thickness of the semiconductor package 200A except for the electrical connection structure 260 may also be smaller than that of the electronic component 300 of an antenna module 500A, 500B, or 500C described above.

The encapsulant 230 may be configured to protect the semiconductor chips 221 and 222, the passive components 225, and the like, and provide an insulating region. An encapsulation form of the encapsulant 230 is not particularly limited, and may be a form in which the encapsulant 230 surrounds at least portions of the semiconductor chips 221 and 222 and the passive components 225. For example, the encapsulant 230 may cover the lower surface of the frame 210, cover side surfaces and the inactive surfaces of the semiconductor chips 221 and 222, and cover side surfaces and lower surfaces of the passive components 225. In addition, the encapsulant 230 may fill spaces in the through-holes 210HA, 210HB, and 210HC. Certain materials of the encapsulant 230 are not particularly limited, and may be, for example, an insulating material such as an ABF, or the like. Alternatively, a photoimageable encapsulant (PIE) may be used as the material of the encapsulant 230. If necessary, the encapsulant 230 may include a plurality of encapsulants such as a first encapsulant encapsulating the passive components 225, a second encapsulant encapsulating the semiconductor chips 221 and 222, and the like.

A backside wiring layer 232 and a backside metal layer 234 may be disposed on a lower surface of the encapsulant 230. The backside wiring layer 232 may be connected to the second wiring layer 212b of the frame 210 through backside connection vias 233 penetrating through the encapsulant 230. The backside metal layer 234 may be connected to the metal layer 215 of the frame 210 through backside metal vias 235 penetrating through the encapsulant 230. Each of the backside wiring layer 232, the backside metal layer 234, the backside connection vias 233, and the backside metal vias 235 may include a conductive material such as copper (Cu), aluminum (Al), silver (Ag), tin (Sn), gold (Au), nickel (Ni), lead (Pb), titanium (Ti), or alloys thereof. The backside wiring layer 232 may include signal patterns, signal via pads, or the like. The backside metal layer 234 may cover the inactive surfaces of the semiconductor chips 221 and 222 and the passive components 225, and may be connected to the metal layer 215 through the backside metal vias 235 to implement an excellent heat dissipation effect and an excellent electromagnetic wave shielding effect. The backside metal layer 234 may also be connected to the ground patterns and/or the power patterns of the wiring layers 212a and 212b of the frame 210 to be used as a ground.

The connection structure 240 may redistribute the connection pads 221P and 222P of the semiconductor chips 221 and 222. Several tens to several hundreds of connection pads 221P and 222P of the semiconductor chips 221 and 222 having various functions may be redistributed by the connection structure 240. In addition, the connection structure 240 may electrically connect the connection pads 221P and 222P of the semiconductor chips 221 and 222 to the passive components 225. In addition, the connection structure 240 may provide an electrical connection path between the semiconductor package 200A and the antenna substrate 100A. The connection structure 240 may include an insulating layer 241, a redistribution layer 242 disposed on the insulating layer 241, and redistribution vias 243 penetrating through the insulating layer 241 and connected to the redistribution layer 242. The connection structure 240 may be formed of a single layer, or may be formed of a plurality of layers of which the number is greater than that illustrated in the drawing.

A material of the insulating layer 241 may be an insulating material. In this case, a photosensitive insulating material such as a PID resin may also be used as the insulating material. That is, the insulating layer 241 may be a photosensitive insulating layer. When the insulating layer 241 has photosensitive properties, the insulating layer 241 may be formed to have a smaller thickness, and a fine pitch of the redistribution via 243 may be achieved more easily. The insulating layer 241 may be a photosensitive insulating layer including an insulating resin and an inorganic filler. When the insulating layers 241 are multiple layers, materials of the insulating layers 241 may be the same as each other, and may also be different from each other, if necessary. When the insulating layers 241 are the multiple layers, the insulating layers 241 may be integrated with each other depending on a process, such that a boundary therebetween may also not be apparent.

The redistribution layer 242 may serve to substantially redistribute the connection pads 221P and 222P. A material of the redistribution layer 242 may be a conductive material such as copper (Cu), aluminum (Al), silver (Ag), tin (Sn), gold (Au), nickel (Ni), lead (Pb), titanium (Ti), or alloys thereof. The redistribution layer 242 may perform various functions depending on a design of a corresponding layer. For example, the redistribution layer 242 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layer 242 may include via pads, connection terminal pads, and the like. The redistribution layer 242 may also include feeding patterns.

The redistribution vias 243 may electrically connect the redistribution layers 242, the connection pads 221P and 222P, or the like, formed on different layers to each other, resulting in an electrical path in the semiconductor package 200A. A material of each of the redistribution vias 243 may be a conductive material such as copper (Cu), aluminum (Al), silver (Ag), tin (Sn), gold (Au), nickel (Ni), lead (Pb), titanium (Ti), or alloys thereof. Each of the redistribution vias 243 may be completely filled with the conductive material, or the conductive material may be formed along a wall of each of via holes. In addition, each of the redistribution vias 243 may have a tapered shape of which a direction is opposite to that of each of the backside connection vias 233 and the backside metal vias 235 described above. The redistribution vias 243 may also include feeding vias.

A first passivation layer 250 having openings 251 exposing at least portions of the redistribution layer 242 may be disposed on the connection structure 240. The first passivation layer 250 may protect the connection structure 240 from external physical or chemical damage. The first passivation layer 250 may include an insulating resin and an inorganic filler, but may not include a glass fiber. For example, the first passivation layer 250 may be formed of an ABF. However, the first passivation layer 250 is not limited thereto, and may also be formed of a PID, a solder resist, or the like.

A plurality of electrical connection structures 260 electrically connected to the exposed redistribution layer 242 may be disposed on the openings 251 of the first passivation layer 250. The electrical connection structures 260 may be configured to physically and/or electrically connect the semiconductor package 200A to the antenna substrate 100A. Each of the electrical connection structures 260 may be formed of a low melting point metal, for example, tin (Sn) or an alloy including tin (Sn), more specifically, a solder. However, this is only an example, and a material of each of the first electrical connection structures 260 is not particularly limited thereto. Each of the electrical connection structures 260 may be a land, a ball, a pin, or the like. The electrical connection structures 260 may be formed as a multilayer or single layer structure. When the electrical connection structures 260 are formed as a multilayer structure, the electrical connection structures 260 may include a copper (Cu) pillar and a solder. When the electrical connection structures 260 are formed as a single layer structure, the electrical connection structures 260 may include a tin-silver solder or copper (Cu). However, this is only an example, and the electrical connection structures 260 are not limited thereto. The number, an interval, a disposition form, and the like, of electrical connection structures 260 are not particularly limited, but may be sufficiently modified depending on design particulars by those skilled in the art.

At least one of the electrical connection structures 260 may be disposed in a fan-out region. The fan-out region refers to a region except for a region in which the semiconductor chips 221 and 222 are disposed. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness, and may have price competitiveness.

A second passivation layer 270 covering at least portions of the backside wiring layer 232 and/or the backside metal layer 234 may be disposed beneath the encapsulant 230. The second passivation layer 270 may protect the backside wiring layer 232 and/or the backside metal layer 234 from external physical or chemical damage. The second passivation layer 270 may also include an insulating resin and an inorganic filler, but may not include a glass fiber. For example, the second passivation layer 270 may be formed of an ABF. However, the second passivation layer 270 is not limited thereto, and may also be formed of a PID, a solder resist, or the like.

The electronic component 300 may be a passive component such as a capacitor, an inductor, or the like, having the thickness t1 greater than the thicknesses t2 and t3 of the semiconductor chips 221 and 222. As a non-restrictive example, the electronic component 300 may be a power inductor (PI) required to have a great thickness in order to have a high inductance. The thickness t1 of the electronic component 300 may be greater than the thickness t4 of the semiconductor package 200A. The electronic component 300 may be mounted on the antenna substrate 100A and be electrically connected to the wiring layer 112 of the antenna substrate 100A. In addition, the electronic component 300 may also be electrically connected to the semiconductor chips 221 and 222 and/or the passive components 225 of the semiconductor package 200A through the wiring layer 112 of the antenna substrate 100A. The electronic component 300 may be mounted on the antenna substrate 100A using a solder adhesive, or the like, but is not limited thereto.

The connector 410 may be disposed beneath the antenna substrate 100A. The connector 410 may be connected to a coaxial cable, a flexible printed circuit board (FPCB), or the like, to provide physical and/or electrical connection paths to other components in a set, when the antenna module 500A is disposed in the set. A material, a shape, or the like, of the connector 410 is not particularly limited, and may be any known material, shape, or the like.

Figure 10:
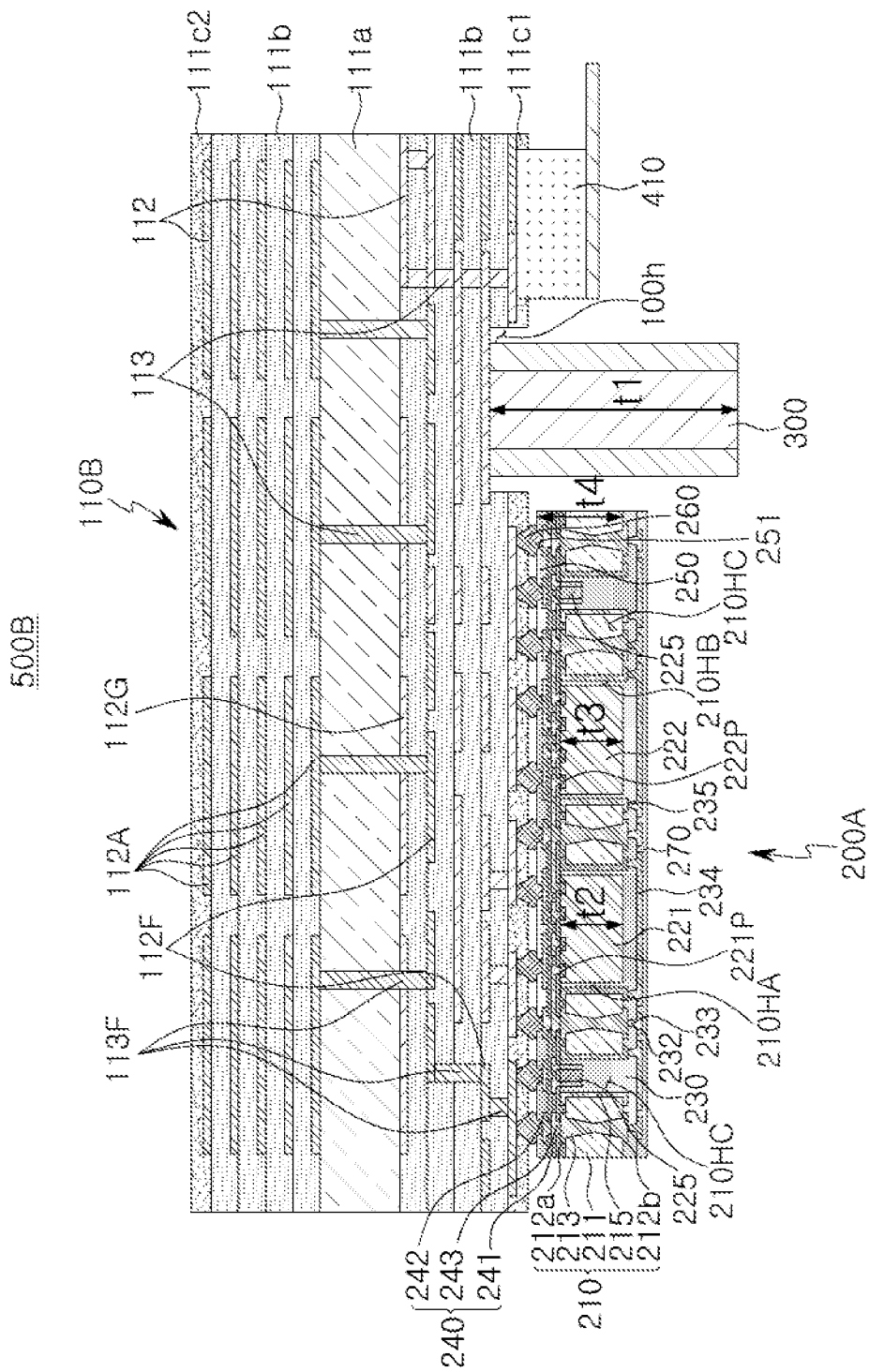
FIG. 10 is a schematic cross-sectional view illustrating an antenna module according to another exemplary embodiment in the present disclosure.

FIG. 10 is a schematic cross-sectional view illustrating an antenna module according to another exemplary embodiment in the present disclosure.

Referring to FIG. 10, in an antenna module 500B according to another exemplary embodiment, a recess portion 100h may be formed in a lower side of an antenna substrate 100B, and an electronic component 300 may be disposed in the recess portion 100h of the antenna substrate 100B. In detail, the antenna substrate 100B may have the recess portion 100h penetrating through a lower passivation layer 111c1 and penetrating through at least a portion of a lower build-up insulating layer 111b, and the electronic component 300 may be mounted on an exposed inner wiring layer 112 of the recess portion 100h using a solder adhesive, or the like, and be electrically connected to the exposed inner wiring layer 112. That is, the electronic component 300 may be directly connected to the inner wiring layer 112 of the antenna substrate 100B rather than an outer layer of the antenna substrate 100B such that a thickness occupied by the electronic component 300 in the antenna module 500B may be reduced. Resultantly, an overall thickness of the antenna module 500B may further be reduced. Other configurations overlap those described above in the antenna module 500A according to the exemplary embodiment, and a detailed description thereof is thus omitted.

Figure 11:
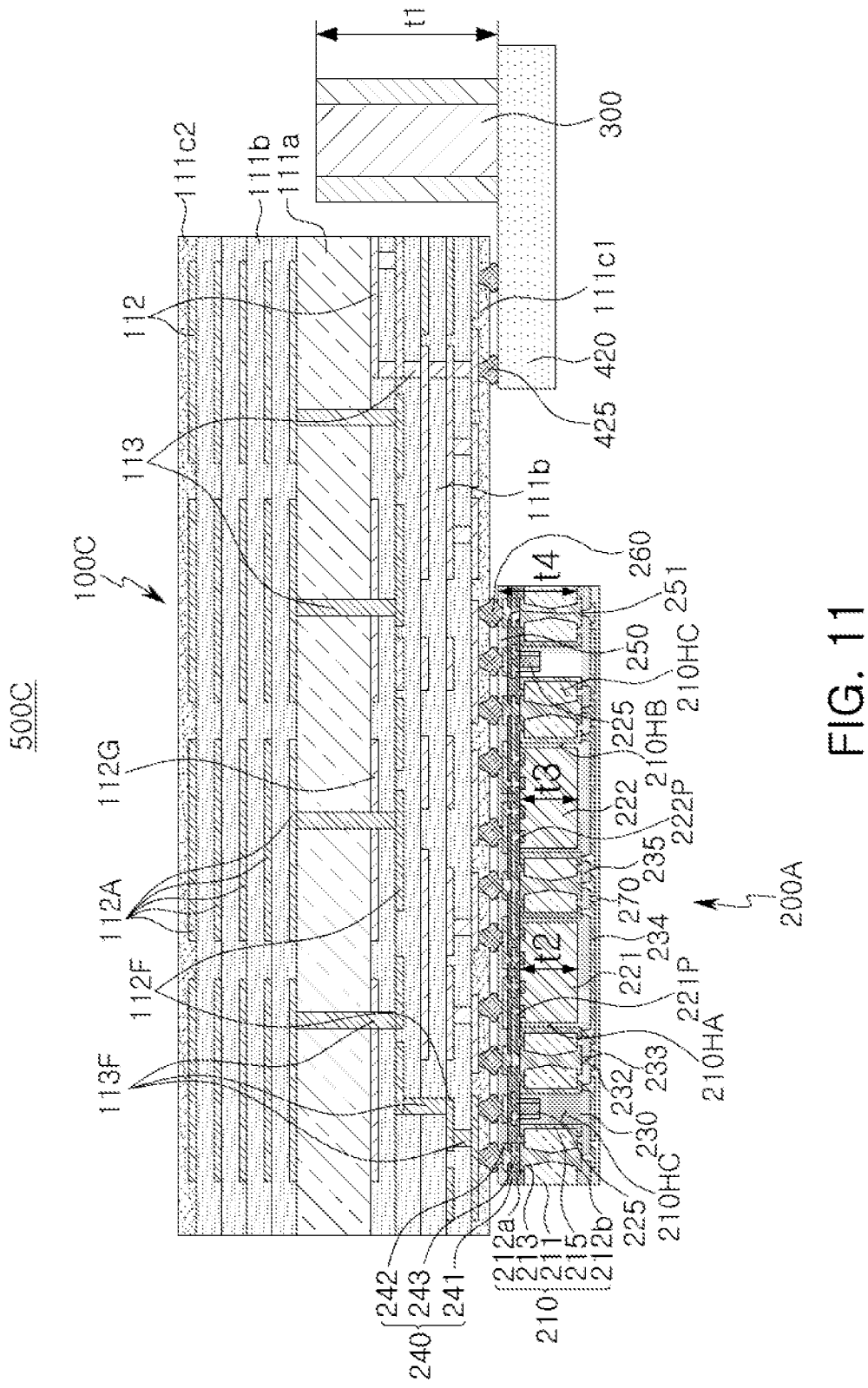
FIG. 11 is a schematic cross-sectional view illustrating an antenna module according to another exemplary embodiment in the present disclosure.

FIG. 11 is a schematic cross-sectional view illustrating an antenna module according to another exemplary embodiment in the present disclosure.

Referring to FIG. 11, in an antenna module 500C according to another exemplary embodiment, a connection substrate 420 may be disposed instead of the connector beneath an antenna substrate 100C and be connected to a lower surface of the antenna substrate 100C. In this case, an electronic component 300 may be surface-mounted on an upper surface of the connection substrate 420 through a low melting point metal 425, or the like, and be electrically connected to the antenna substrate 100C through the connection substrate 420. That is, the electronic component 300 having a great thickness may be disposed on a side portion of the antenna substrate 100C through the connection substrate 420. Therefore, an overall thickness of the antenna module 500C may further be reduced. The connection substrate 420 may be connected to the lower surface of the antenna substrate 100C using the low melting point metal 425 such as a solder ball, or the like. The connection substrate 420 may be any known rigid-flexible printed circuit board (RFPCB) or a flexible PCB (FPCB), and the antenna module 500C may be electrically connected to other components in a set, such as a mainboard, and the like, through the connection substrate 420. Other configurations overlap those described above in the antenna module 500A according to the exemplary embodiment, and a detailed description thereof is thus omitted.

Figure 12:
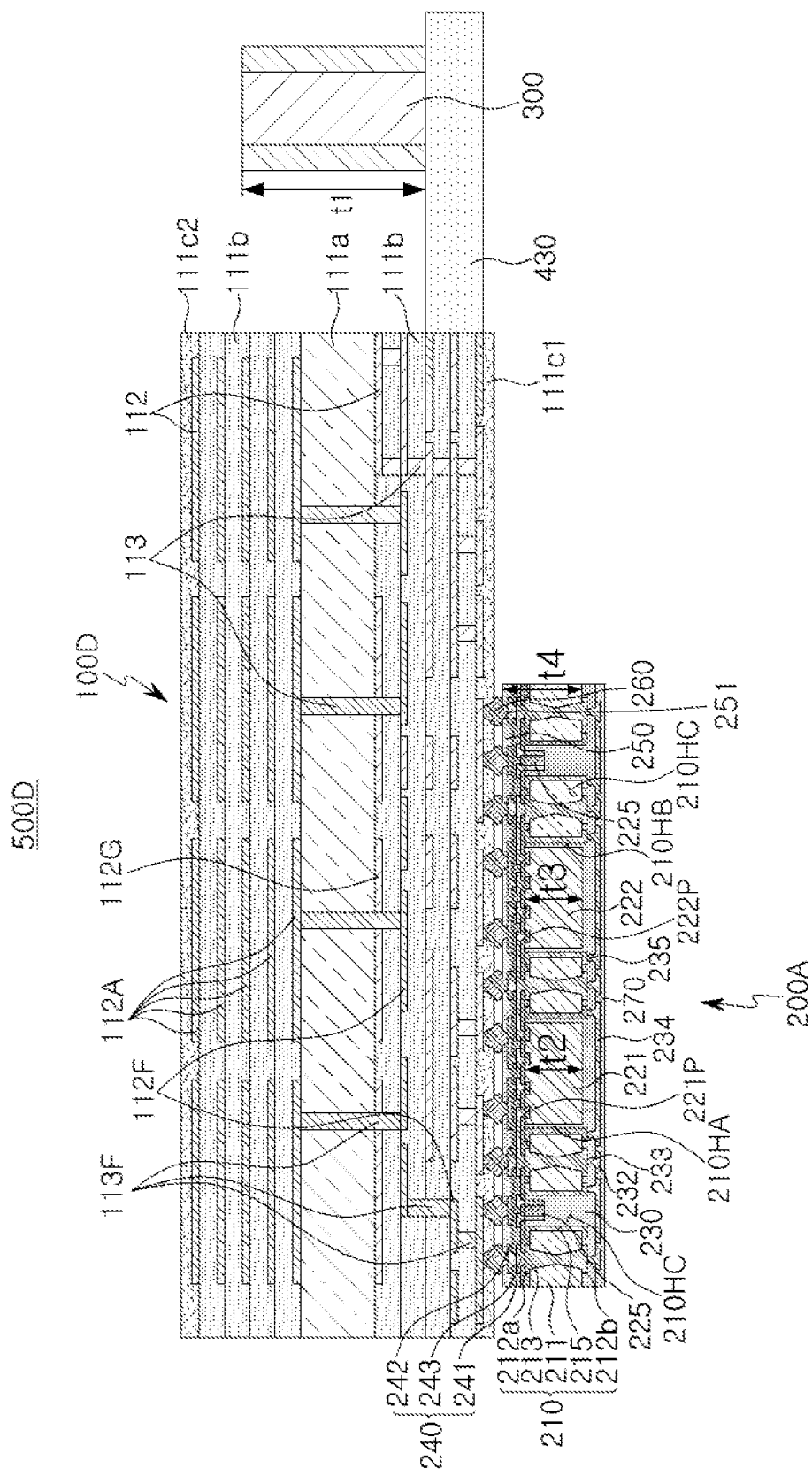
FIG. 12 is a schematic cross-sectional view illustrating an antenna module according to another exemplary embodiment in the present disclosure.

FIG. 12 is a schematic cross-sectional view illustrating an antenna module according to another exemplary embodiment in the present disclosure.

Referring to FIG. 12, in an antenna module 500D according to another exemplary embodiment, a connection substrate 430 may be disposed instead of the connector on a side portion of an antenna substrate 100D and be connected to a side surface of the antenna substrate 100D. In this case, an electronic component 300 may be surface-mounted on an upper surface of the connection substrate 430 through a solder adhesive, or the like, and be electrically connected to the antenna substrate 100D through the connection substrate 430. That is, the electronic component 300 having a great thickness may be disposed on the side portion of the antenna substrate 100D through the connection substrate 430. Therefore, an overall thickness of the antenna module 500D may further be reduced. The connection substrate 430 may be any known RFPCB or FCPB integrated with the antenna substrate 100D. For example, one or two lower insulating layers 111b of the antenna substrate 100D may be insulating layers formed of a material having flexible characteristics, such as polyimide and provide a flexible PCB region out of a rigid PCB region of the antenna substrate 100D, a rigid PCB region may be formed at an end portion of the flexible PCB region, if necessary, and the flexible PCB region or a flexible-rigid PCB region may be used as the connection substrate 430. That is, the antenna substrate 100D itself may be a rigid-flexible PCB (RFPCB) or a rigid-flexible-rigid (RFRPCB). In this case, the rigid PCB region may be used as the antenna substrate 100D, and the flexible PCB region or the flexible-rigid PCB region may be used as the connection substrate 430. The antenna module 500D may be electrically connected to other components in a set, such as a mainboard, and the like, in a set through the connection substrate 430. Other configurations overlap those described above in the antenna module 500A according to the exemplary embodiment, and a detailed description thereof is thus omitted.

Figure 13:
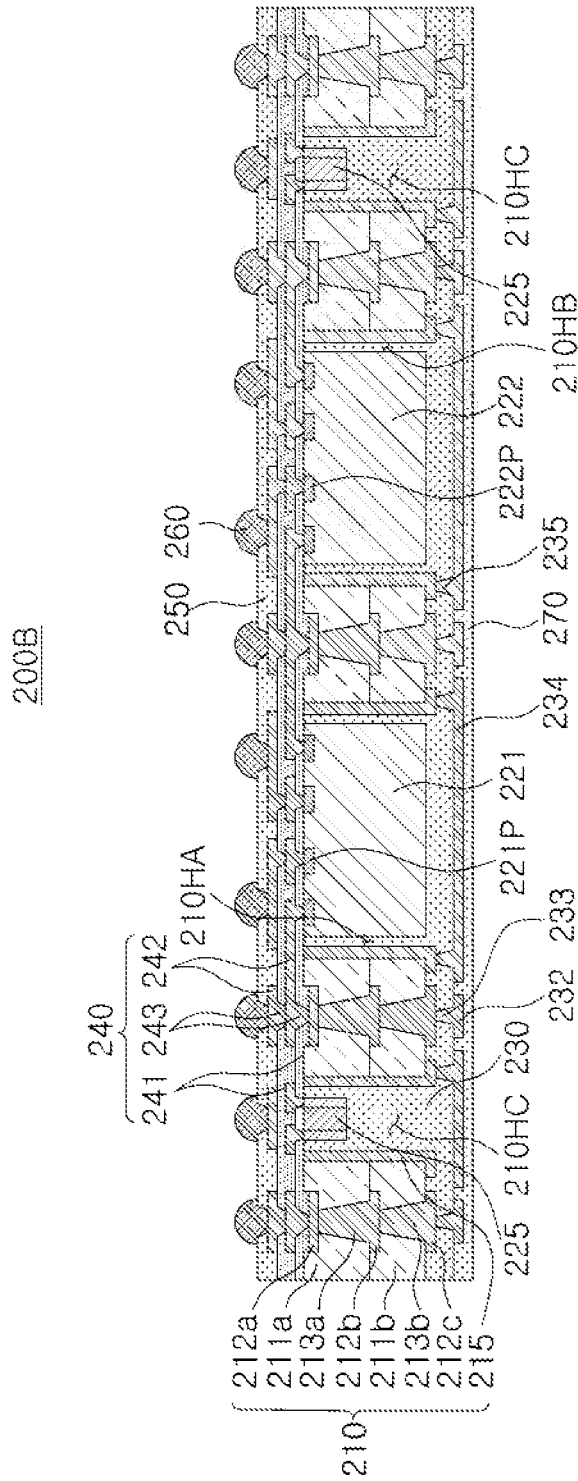
FIG. 13 is a schematic cross-sectional view illustrating a semiconductor package according to another exemplary embodiment used in the antenna module.

FIG. 13 is a schematic cross-sectional view illustrating a semiconductor package according to another exemplary embodiment used in the antenna module.

Referring to FIG. 13, in a semiconductor package 200B according to another exemplary embodiment, a frame 210 may include a first insulating layer 211a, a first wiring layer 212a embedded in an upper side of the first insulating layer 211a so that an upper surface thereof is exposed, a second wiring layer 212b disposed on a lower surface of the first insulating layer 211a, a second insulating layer 211b disposed on the lower surface of the first insulating layer 211a and covering the second wiring layer 212b, and a third wiring layer 212c disposed on a lower surface of the second insulating layer 211b. Since the frame 210 may include a large number of wiring layers 212a, 212b, and 212c, a connection structure 240 may further be simplified. Therefore, a decrease in a yield depending on a defect occurring in a process of forming the connection structure 240 may be suppressed. The first and second wiring layers 212a and 212b and the second and third wiring layers 212b and 212c may be electrically connected to each other through first and second connection vias 213a and 213b penetrating through the first and second insulating layers 211a and 211b, respectively.

When the first wiring layer 212a is embedded in the first insulating layer 211a, a step generated due to a thickness of the first wiring layer 212a may be significantly reduced, and an insulating distance of the connection structure 240 may thus become constant. That is, a difference between a distance from a redistribution layer 242 of the connection structure 240 to an upper surface of the first insulating layer 211a and a distance from the redistribution layer 242 of the connection structure 240 to connection pads 221P and 222P of semiconductor chips 221 and 222 may be smaller than a thickness of the first wiring layer 212a. Therefore, a high density wiring design of the connection structure 240 may be easy.

A distance between the redistribution layer 242 of the connection structure 240 and the first wiring layer 212a of the frame 210 may be greater than that between the redistribution layer 242 of the connection structure 240 and the connection pads 221P and 222P of the semiconductor chips 221 and 222. The reason is that the first wiring layer 212a may be recessed into the first insulating layer 211a. As described above, when the first wiring layer 212a is recessed into the first insulating layer 211a, such that the upper surface of the first insulating layer 211a and the upper surface of the first wiring layer 212a have a step therebetween, a phenomenon in which a material of an encapsulant 230 bleeds to pollute the first wiring layer 212a may be prevented. The second wiring layer 212b of the frame 210 may be disposed on a level between an active surface and an inactive surface of each of the semiconductor chips 221 and 222.

Thicknesses of the wiring layers 212a, 212b, and 212c of the frame 210 may be greater than those of the redistribution layers 242 of the connection structure 240. Since the frame 210 may have a thickness equal to or greater than that of the semiconductor chips 221 and 222, the wiring layers 212a, 212b, and 212c may be formed to have large sizes depending on a scale of the frame 210. On the other hand, the redistribution layers 242 of the connection structure 240 may be formed to have sizes relatively smaller than those of the wiring layers 212a, 212b, and 212c for thinness.

A material of each of the insulating layers 211a and 211b is not particularly limited. For example, an insulating material may be used as the material of each of the insulating layers 211a and 211b. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, Bismaleimide Triazine (BT), or the like. Alternatively, a PID resin may also be used as the insulating material.

The wiring layers 212a, 212b, and 212c may serve to redistribute the connection pads 221P and 222P of the semiconductor chips 221 and 222. A material of each of the wiring layers 212a, 212b, and 212c may be a conductive material such as copper (Cu), aluminum (Al), silver (Ag), tin (Sn), gold (Au), nickel (Ni), lead (Pb), titanium (Ti), or alloys thereof. The wiring layers 212a, 212b, and 212c may perform various functions depending on designs of corresponding layers. For example, the wiring layers 212a, 212b, and 212c may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring layers 212a, 212b, and 212c may include signal via pads, ground via pads, and the like. In addition, the wiring layers 212a, 212b, and 212c may include feeding patterns.

The connection vias 213a and 213b may electrically connect the wiring layers 212a, 212b, and 212c formed on different layers to each other, resulting in an electrical path in the frame 210. A material of each of the connection vias 213a and 213b may be a conductive material. Each of the connection vias 213a and 213b may be completely filled with the conductive material, or the conductive material may be formed along a wall of each of via holes. In addition, each of the connection vias 213a and 213b may have a tapered shape of which a direction is opposite to that of each of redistribution vias 243 of the connection structure 240. When holes for the first connection vias 213a are formed, some of the pads of the first wiring layer 212a may serve as a stopper, and it may thus be advantageous in a process that each of the first connection vias 213a has the tapered shape of which a width of a lower surface is greater than that of an upper surface. In this case, the first connection vias 213a may be integrated with pad patterns of the second wiring layer 212b. In addition, when holes for the second connection vias 213b are formed, some of the pads of the second wiring layer 212b may serve as a stopper, and it may thus be advantageous in a process that each of the second connection vias 213b has the tapered shape of which a width of a lower surface is greater than that of an upper surface. In this case, the second connection vias 213b may be integrated with pad patterns of the third wiring layer 212c.

A structure of the semiconductor package 200B according to another exemplary embodiment may be applied to the antenna module 500A, 500B, 500C, or 500D described above. Other configurations overlap those described above in the semiconductor package 200A according to the exemplary embodiment, and a description thereof is thus omitted.

Figure 14:
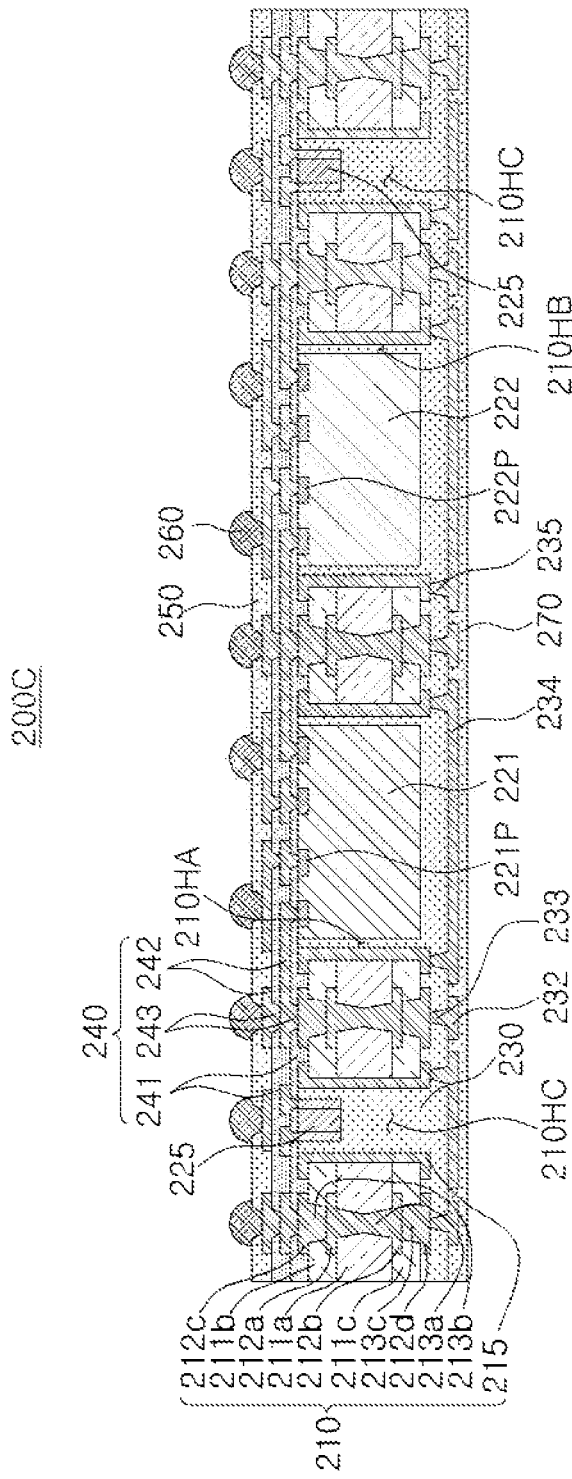
FIG. 14 is a schematic cross-sectional view illustrating a semiconductor package according to another exemplary embodiment used in the antenna module.

FIG. 14 is a schematic cross-sectional view illustrating a semiconductor package according to another exemplary embodiment used in the antenna module.

Referring to FIG. 14, in a semiconductor package 200C, a frame 210 may include a first insulating layer 211a, a first wiring layer 212a and a second wiring layer 212b disposed on upper and lower surfaces of the first insulating layer 211a, respectively, a second insulating layer 211b disposed on the first insulating layer 211a and covering the first wiring layer 212a, a third wiring layer 212c disposed on an upper surface of the second insulating layer 211b, a third insulating layer 211c disposed on the lower surface of the first insulating layer 211a and covering the second wiring layer 212b, and a fourth wiring layer 212d disposed on a lower surface of the third insulating layer 211c. Since the frame 210 may include a large number of wiring layers 212a, 212b, 212c, and 212d, a connection structure 240 may further be simplified. Therefore, a decrease in a yield depending on a defect occurring in a process of forming the connection structure 240 may be suppressed. Meanwhile, the first to fourth wiring layers 212a, 212b, 212c, and 212d may be electrically connected to each other through first to third connection vias 213a, 213b, and 213c respectively penetrating through the first to third insulating layers 211a, 211b, and 211c.

A material of each of the insulating layers 211a, 211b, and 211c is not particularly limited. For example, an insulating material may be used as the material of each of the insulating layers 211a, 211b, and 211c. In this case, the insulating material may be a thermosetting resin such as an epoxy resin, a thermoplastic resin such as a polyimide resin, a resin in which the thermosetting resin or the thermoplastic resin is mixed with an inorganic filler or is impregnated together with an inorganic filler in a core material such as a glass fiber (or a glass cloth or a glass fabric), for example, prepreg, ABF, FR-4, BT, or the like. Alternatively, a PID resin may also be used as the insulating material.

The first insulating layer 211a may have a thickness greater than those of the second insulating layer 211b and the third insulating layer 211c. The first insulating layer 211a may be basically relatively thick in order to maintain rigidity, and the second insulating layer 211b and the third insulating layer 211c may be introduced in order to form a larger number of wiring layers 212c and 212d. The first insulating layer 211a may include an insulating material different from those of the second insulating layer 211b and the third insulating layer 211c. For example, the first insulating layer 211a may be, for example, prepreg including a core material, a filler, and an insulating resin, and the second insulating layer 211b and the third insulating layer 211c may be an ABF or a PID film including a filler and an insulating resin. However, the materials of the first insulating layer 211a and the second and third insulating layers 211b and 211c are not limited thereto.

The wiring layers 212a, 212b, 212c, and 212d may serve to redistribute connection pads 221P and 222P of semiconductor chips 221 and 222. A material of each of the wiring layers 212a, 212b, 212c, and 212d may be a conductive material such as copper (Cu), aluminum (Al), silver (Ag), tin (Sn), gold (Au), nickel (Ni), lead (Pb), titanium (Ti), or alloys thereof. The wiring layers 212a, 212b, 212c, and 212d may perform various functions depending on designs of corresponding layers. For example, the wiring layers 212a, 212b, 212c, and 212d may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring layers 212a, 212b, 212c, and 212d may include signal via pads, ground via pads, and the like. In addition, the wiring layers 212a, 212b, 212c, and 212d may include feeding patterns.

The first wiring layer 212a and the second wiring layer 212b may be disposed on a level between an active surface and an inactive surface of each of the semiconductor chips 221 and 222. Thicknesses of the wiring layers 212a, 212b, 212c, and 212d of the frame 210 may be greater than those of redistribution layers 242 of the connection structure 240.

The connection vias 213a, 213b, and 213c may electrically connect the wiring layers 212a, 212b, 212c, and 212d formed on different layers to each other, resulting in an electrical path in the frame 210. A material of each of the connection vias 213a, 213b, and 213c may be a conductive material. Each of the connection vias 213a, 213b, and 213c may be completely filled with the conductive material, or the conductive material may also be formed along a wall of each of via holes. The first connection vias 213a may have an hourglass shape or a cylindrical shape, and the second and third connection vias 213b and 213c may have tapered shapes of which directions are opposite to each other. The first connection vias 213a penetrating through the first insulating layer 211a may have a diameter greater than those of the second and third connection vias 213b and 213c each penetrating through the second and third insulating layers 211b and 211c.

A structure of the semiconductor package 200C according to another exemplary embodiment may be applied to the antenna module 500A, 500B, 500C, or 500D described above. Other configurations overlap those described above in the semiconductor package 200A according to the exemplary embodiment, and a description thereof is thus omitted.

Figure 15:
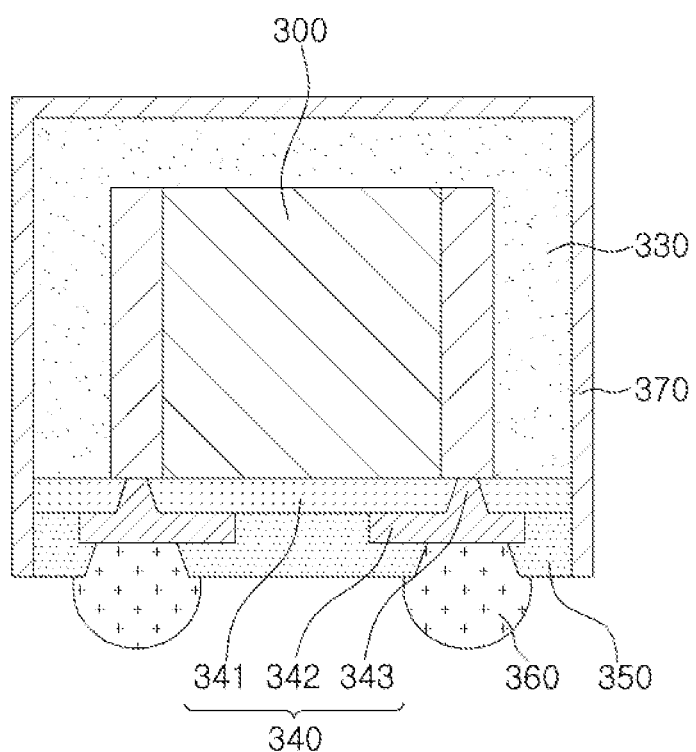
FIG. 15 is a schematic cross-sectional view illustrating an electronic component according to another exemplary embodiment used in an antenna module.

FIG. 15 is a schematic cross-sectional view illustrating an electronic component according to another exemplary embodiment used in an antenna module.

Referring to FIG. 15, an electronic component 300 may be used in a form of a packaged component 310 in the antenna module 500A, 500B, 500C, or 500D described above. The packaged component 310 may include the electronic component 300; an encapsulant 330 covering at least portions of the electronic component 300; a wiring structure 340 including an insulating layer 341 formed beneath the electronic component 300, a wiring layer 342 formed on a lower surface of the insulating layer 341, and connection vias 343 penetrating through the insulating layer 341 and electrically connecting electrodes of the electronic component 300 and the wiring layer 342 to each other; a passivation layer 350 disposed beneath the wiring structure 340 and having openings exposing at least portions of the wiring layer 342, electrical connection structures 360 disposed on the exposed openings of the passivation layer 350 and connected to the wiring layer 342; and a metal layer 370 formed on outer surfaces of the encapsulant 330. That is, the electronic component 300 may be disposed in a packaged state. In this case, electromagnetic waves generated from the electronic component 300 or electromagnetic waves introduced from an external source into the electronic component 300 may be effectively shielded through the metal layer 370.

A material of the encapsulant 330 may be any known insulating material such as an ABF, an EMC, or the like. A material of the insulating layer 341 may be any known insulating material such as an ABF, a PID, or the like. A material of each of the wiring layer 342 and the connection via 343 may be any known conductive material such as copper (Cu), or the like. A material of the passivation layer 350 may be any known insulating material such as an ABF, a solder resist, or the like. A material of each of the electrical connection structures 360 may be a low melting point metal such as a solder. A material of the metal layer 370 may be any known metal such as copper (Cu).

As set forth above, according to an exemplary embodiment in the present disclosure, an antenna module of which a degree of freedom may be secured when the antenna module is mounted in a set by a reduction in an overall thickness thereof may be provided.

While exemplary embodiments have been shown and described above, it will be apparent to those skilled in the art that modifications and variations could be made without departing from the scope of the present invention as defined by the appended claims.

What is claimed is:

1. An antenna module comprising:
an antenna substrate including an antenna pattern;
a semiconductor package disposed on a lower surface of the antenna substrate, electrically connected to the antenna substrate, and having at least one semiconductor chip embedded therein; and
an electronic component disposed at a side of the antenna substrate, electrically connected to the antenna substrate, and spaced apart from the semiconductor package by a predetermined distance,
wherein the antenna module further comprises a connection substrate connected to a portion of the antenna substrate, the connection substrate having an extension portion extending outward from the side of the antenna substrate, and
the electronic component is disposed on the extension portion of the connection substrate to electrically connect to an inner wiring layer of the antenna substrate,
wherein the semiconductor package includes a frame having a first through-hole, a first semiconductor chip of the at least one semiconductor chip disposed in the first through-hole and having a first active surface having first connection pads disposed thereon, an encapsulant covering the first semiconductor chip and filling the first through-hole, and a connection structure disposed on the frame and the first active surface of the first semiconductor chip and including redistribution layers electrically connected to the first connection pads.

2. The antenna module of claim 1, wherein the electronic component has a thickness greater than a thickness of the at least one semiconductor chip.

3. The antenna module of claim 1, wherein the electronic component includes a passive component.

4. The antenna module of claim 1, wherein the connection substrate is a flexible printed circuit board (FPCB) or a rigid-flexible PCB (RFPCB) connected to the lower surface of the antenna substrate through a low melting point metal.

5. The antenna module of claim 1, wherein the connection substrate is a flexible printed circuit board (FPCB) or a rigid-flexible PCB (RFPCB) integrated with the antenna substrate.

6. The antenna module of claim 1, wherein the at least one semiconductor chip includes a radio frequency integrated circuit (RFIC) and a power management integrated circuit (PMIC).

7. The antenna module of claim 6, wherein at least one passive component is further embedded in the semiconductor package.

8. The antenna module of claim 1, wherein the electronic component is a power inductor (PI).

9. The antenna module of claim 1, wherein the thickness of the electronic component is greater than a thickness of the semiconductor package.

10. The antenna module of claim 1, wherein the semiconductor package includes the frame having the first through-hole, the first semiconductor chip disposed in the first through-hole and having the first active surface having the first connection pads disposed thereon and a first inactive surface opposing the first active surface, the encapsulant covering at least portions of each of the frame and the first inactive surface of the first semiconductor chip and filling at least portions of the first through-hole, and the connection structure disposed on the frame and the first active surface of the first semiconductor chip and including the redistribution layers electrically connected to the first connection pads.

11. The antenna module of claim 10, wherein the frame further has a second through-hole spaced apart from the first through-hole and a third through-hole spaced apart from the first through-hole and the second through-hole,
a second semiconductor chip is disposed in the second through-hole, the second semiconductor chip having a second active surface having second connection pads disposed thereon and a second inactive surface opposing the second active surface, and a passive component is disposed in the third through-hole.

12. The antenna module of claim 11, wherein the frame includes a metal layer disposed on walls of the first through-hole, the second through-hole and the third through-hole and extending to a lower surface of the frame, and the semiconductor package further includes a backside metal layer disposed on a lower surface of the encapsulant and backside metal vias penetrating through the encapsulant and connecting the backside metal layer to the metal layer of the frame.

13. The antenna module of claim 10, wherein the frame includes an insulating layer, a first wiring layer disposed on an upper surface of the insulating layer, a second wiring layer disposed on a lower surface of the insulating layer, and connection vias penetrating through the insulating layer and electrically connecting the first wiring layer to the second wiring layer.

14. The antenna module of claim 13, wherein the semiconductor package further includes a backside wiring layer disposed on a lower surface of the encapsulant and backside connection vias penetrating through the encapsulant and connecting the backside wiring layer to the second wiring layer of the frame.

15. The antenna module of claim 10, wherein the frame includes a first insulating layer, a first wiring layer disposed on an upper surface of the first insulating layer, a second wiring layer disposed on a lower surface of the first insulating layer, a second insulating layer disposed on the upper surface of the first insulating layer and covering the first wiring layer, a third wiring layer disposed on an upper surface of the second insulating layer, a third insulating layer disposed on the lower surface of the first insulating layer and covering the second wiring layer, a fourth wiring layer disposed on a lower surface of the third insulating layer, first connection vias penetrating through the first insulating layer and electrically connecting the first wiring layer to the second wiring layer, second connection vias penetrating through the second insulating layer and electrically connecting the first wiring layer to the third wiring layer, and third connection vias penetrating through the third insulating layer and electrically connecting the second wiring layer to the fourth wiring layer.

16. The antenna module of claim 10, wherein the frame includes a first insulating layer, a first wiring layer embedded in an upper side of the first insulating layer so that an upper surface of the first wiring layer is exposed, a second wiring layer disposed on a lower surface of the first insulating layer, a second insulating layer disposed on the lower surface of the first insulating layer and covering the second wiring layer, a third wiring layer disposed on a lower surface of the second insulating layer, first connection vias penetrating through the first insulating layer and electrically connecting the first wiring layer to the second wiring layer, and second connection vias penetrating through the second insulating layer and electrically connecting the second wiring layer to the third wiring layer.

17. An antenna module comprising:
an antenna substrate including an antenna pattern;
a semiconductor package disposed on a lower surface of the antenna substrate, electrically connected to the antenna substrate, and having at least one semiconductor chip embedded therein; and
an electronic component disposed at a side of the antenna substrate, electrically connected to the antenna substrate, and spaced apart from the semiconductor package by a predetermined distance,
wherein the antenna module further comprises a connection substrate connected to the lower surface of the antenna substrate, the connection substrate having an extension portion extending outward from the side of the antenna substrate,
the electronic component is disposed at the side of the antenna substrate and on the extension portion of the connection substrate, and
the electronic component is electrically connected to an inner wiring layer of the antenna substrate through the connection substrate.

18. The antenna module of claim 17, wherein the electronic component is spaced apart from the semiconductor package by the predetermined distance on the extension portion of the connection substrate.

19. The antenna module of claim 17, wherein the thickness of the electronic component is greater than a thickness of the semiconductor package.

20. An antenna module comprising:
an antenna substrate including an antenna pattern;
a semiconductor package disposed on a lower surface of the antenna substrate, electrically connected to the antenna substrate, and having at least one semiconductor chip embedded therein; and
an electronic component disposed at a side of the antenna substrate, electrically connected to the antenna substrate,
wherein the antenna module further comprises a connection substrate connected to a side surface of the antenna substrate, the connection substrate having an extension portion extending outward from the side of the antenna substrate,
the electronic component is disposed at the side of the antenna substrate and on the extension portion of the connection substrate, and
the electronic component is electrically connected to an inner wiring layer of the antenna substrate through the connection substrate.

* * * * *